United States Patent
Hulse et al.

(10) Patent No.: US 6,618,847 B1
(45) Date of Patent: Sep. 9, 2003

(54) POWER STABILIZER USING UNDER-UTILIZED STANDARD CELLS

(75) Inventors: Michael B. Hulse, Chandler, AZ (US); Raffaele Fusciello, Phoenix, AZ (US); Peter Ruddy, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/191,494

(22) Filed: Nov. 13, 1998

(51) Int. Cl.⁷ .................................. G06F 17/50
(52) U.S. Cl. ................. 716/8; 716/2; 716/4; 716/7; 716/14
(58) Field of Search .................. 257/296; 438/394; 365/145; 716/2, 14, 4, 7, 8

(56) References Cited

U.S. PATENT DOCUMENTS

| | | | | |
|---|---|---|---|---|
| 5,208,176 A | * | 5/1993 | Ahmad | 438/394 |
| 5,801,412 A | * | 9/1998 | Tobita | 257/296 |
| 6,067,409 A | * | 5/2000 | Scepanovic et al. | 716/8 |
| 6,185,123 B1 | * | 2/2001 | Allen | 365/145 |
| 6,292,929 B2 | * | 9/2001 | Scepanovic et al. | 716/14 |

* cited by examiner

*Primary Examiner*—Matthew Smith
*Assistant Examiner*—Thuan Do
(74) *Attorney, Agent, or Firm*—Lisa K. Jorgenson; William J. Kubida

(57) ABSTRACT

A system and method is provided for placing gate capacitors, or other performance enhancing electrical components, in an under-utilized standard cell region. The present invention is a layout design tool that allows the designed to automatically intersperse capacitor filler cells around standard cell logic. The present invention includes creating a region, allocated to the particular standard cell, which has (either by intention or situation) low utilization. The design tool of the present invention can also be used to intentionally under-utilize various functional blocks in order to create areas that can be filled with cells containing gate capacitors. The standard cells may or may not be associated with surrounding logic. The place and route filler cells are redefined to include gate capacitors using abutment rules compatible with the standard cells. This allows the place and route tool, or the like, to locate gate capacitors in the "legal" placement locations not used by standard cells within the under-utilized region. The standard cell region being used for this purpose shares the power and ground supply with the power sensitive areas of the logic.

20 Claims, 12 Drawing Sheets

POWER STABILIZER USING UNDER-UTILIZED STANDARD CELLS

BACKGROUND OF THE INVENTION

1. Field of the Invention

The present invention relates to optimizing the electrical characteristics of an integrated circuit (IC) by modifying the physical layout of the IC. More specifically, the present invention determines when regions of the IC, related to various standard cells, in the IC design are under-utilized. The present invention then includes appropriate electrical components in such under-utilized areas to increase electrical performance, such as stabilizing the power supplied to various logic areas of the IC, such as super blocks or macros.

2. Description of Related Art

As integrated circuit technology becomes more advanced, geometries (line width, cross-sectional area and spacing) become smaller causing parasitics (e.g. electrical noise) to become larger. Further, today's advanced technologies are driving voltages to become lower and speeds to become faster. This causes a greater need for on-chip bypass capacitance in order to stabilize the power supply to the logic components of the chip.

Additionally, there are situations with deep sub-micron designs when it is a problem to ensure a stable power and ground supply in areas of the floorplan such as high-speed logic areas, high density logic areas and areas which are substantial distances for a stable power source.

Typically, circuit designers provide gate capacitors to stabilize the power supplies, but this capacitor region is usually separated from the affected logic. That is, the gate capacitors of the prior art are remote from the logic which is most affected by the electrical parasitics. Due to this separation, the prior art gate capacitors can only minimally improve the electrical power characteristics of the logic they were intended to support.

Therefore, it can be seen that a need exists for a technique that can efficiently and automatically place gate capacitors, or other electrical components near the logic that requires a stable power supply during the physical layout of an integrated circuit.

SUMMARY OF THE INVENTION

When performing the physical layout of an integrated circuit, there are times when various conditions leave an under-utilized space relative to the amount of logic to be placed in a specific area of the chip.

In contrast to the prior art, the present invention provides a system and method for placing gate capacitors, or other performance enhancing electrical components, in an under-utilized standard cell region. Further, it is contemplated by the present invention to intentionally under utilize various functional blocks in order to create areas that can be filled with cells containing gate capacitors.

Broadly, the present invention is a layout design tool that allows the designer to automatically intersperse capacitor filler cells among standard cell logic. The present invention includes creating a region, allocated to the particular standard cell, which has (either by intention or situation) low utilization. The standard cells may or may not be associated with surrounding logic. The place and route filler cells are redefined to include gate capacitors using abutment rules compatible with the standard cells. This allows the place and route tool, or the like, to locate gate capacitors in the "legal" placement locations not used by standard cells within the under-utilized region. The standard cell region being used for this purpose shares the power and ground supply with the power sensitive areas of the logic. The present invention provides a stable power supply throughout the die with improved efficiency due to block abutments and/or timing constraints between areas using standard cell glue logic and the reduction in time required for implementation of power/ground bypass capacitors.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
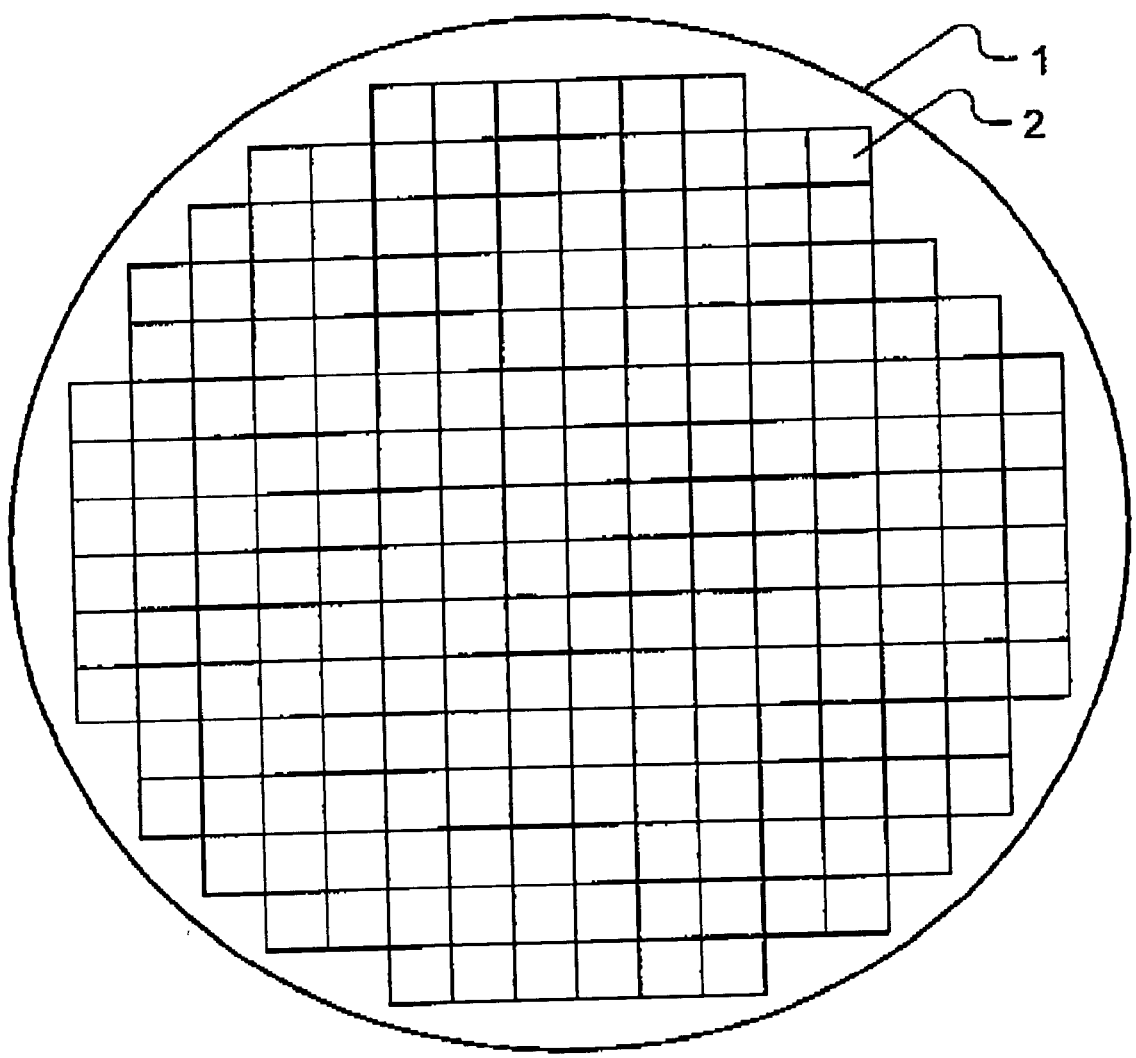
FIG. 1 is a diagram showing the layout of a wafer which includes a plurality of integrated circuit chips.

Referring to FIG. 1, a wafer 1 made substantially of silicon is shown that includes a plurality of integrated circuits (IC) 2. After fabrication, the wafer is diced and the individual ICs 2 are separated, tested and packaged to include the interconnection interface to the data processing system in which they are to be used. For example, an IC chip 2 may be placed in a dual in line package (DIP) or populated with solder balls for direct attachment to a printed circuit board (PCB) or the like. These ICs may perform various data processing functions and include devices such as memory chips, microprocessors, application specific integrated circuits (ASICs), or the like.

Figure 2:
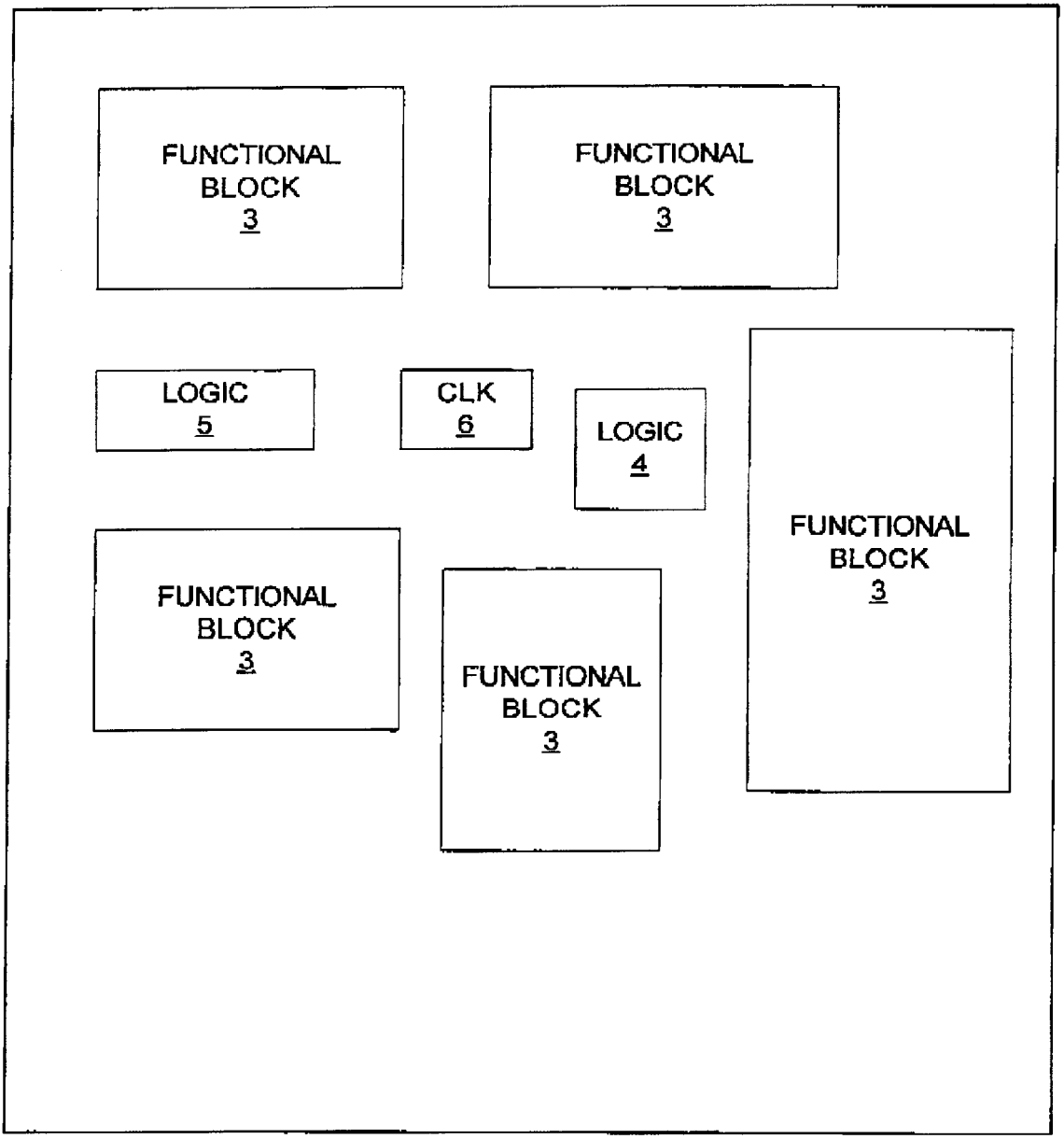
FIG. 2 is a block diagram of various macros that may be included in one of the integrated circuit chips of FIG. 1.

FIG. 2 is a block diagram showing various super blocks, or macros which make up the functional units included on chip 2. Basically, macros are circuits, or groups of circuits which provide various functions to the IC. These macros may include many thousands of individual transistors which implement the actual functions, such as storing bits of information in a matrix, or row of latches in the case of memory, buffers, registers and the like. Reference numeral 3 is used to designate several of these macros which may be used to provide one of several data processing functions. For example, if IC 2 is a microprocessor, functional block 3 could be a memory (L1 cache), execution unit (floating point, fixed point), decode unit, reservation station, fetch unit, registers or the like. A clock 6 is shown which will generate a timing signal that may be used by IC 2 to latch data into its memory elements or the like. Macros 4 and 5 are shown which also will perform various functions required by chip 2.

Clock 6 will be used to describe one example of a preferred embodiment of the present invention. Those skilled in the art will appreciate that macros which require a great deal of electrical power are also very susceptible to noise and other detrimental electrical parasitics. Clock circuits typically require a substantial amount of electrical power, consequently, these circuits are also most susceptible to electrical noise which may be present in the IC. Thus, a clock circuit is one type of functional unit that will particularly benefit from use of the present invention. Additionally, large driver circuits also typically require a significant amount of electrical power and will benefit greatly by the present invention.

Those skilled in the art will understand that macros are the highest logical functional block. The macros are made up of standard cells which are the actual gates, such as NAND, NOR, AND, OR gates and the like. Layout tools used in the design of integrated circuits include libraries of gates that are all compatible with one another. These tools, such as Silicon Ensemble Cell3 commercially available from Cadence Design Systems, generally try to minimize the amount of area on the silicon that is required to perform the various functions implemented by the macros. To do this, the tools will run various placement algorithms designed to minimize the standard cell area to most efficiently utilize the available area of the IC. The IC designer will determine the attempted utilization and then use these tools to optimize the layout. The computer and semiconductor industries have made great strides in placing increasingly more gates on a single substrate. While the trend is clearly to increase the density of gates on an IC to correspondingly decrease the overall size of the chips, as noted above, this denser population of gates causes increases in the electrical noise which is present at various blocks on the substrate. This increase in electrical noise can be attributed to placing lower voltage power supply lines closer to high speed logic elements contained in the macros.

In one embodiment of the present invention a conventional place and route tool may place the macros on a chip as shown in FIG. 2, i.e. clock 6 is centrally located in order to help reduce clock skew with corresponding functional blocks 3 and logic macros 4 and 5 distributed therearound. It should be noted that conventional placement of gate capacitors would occur in an unused area of the chip 2, such as area 7. It can be seen that any capacitors placed in area 7 are a relatively great distance from clock 6 which, in the current example, is the circuit requiring additional capacitance in order to decrease its susceptibility to electrical parasitics. While, there are other unused areas of the chip shown in FIG. 2, the placement of any gate capacitors using convention techniques would be arbitrary. Thus, it would be impossible to ensure that the placement of the capacitors would be near to the circuits most in need of the capacitance. Those skilled in the art will recognize that conventional techniques to provide gate capacitors place such capacitors around the periphery of the chip itself, i.e. around the edge of IC 2. Thus, using known methods the gate capacitors would be place a great distance from the macros actually needing the capacitance.

Figure 3:
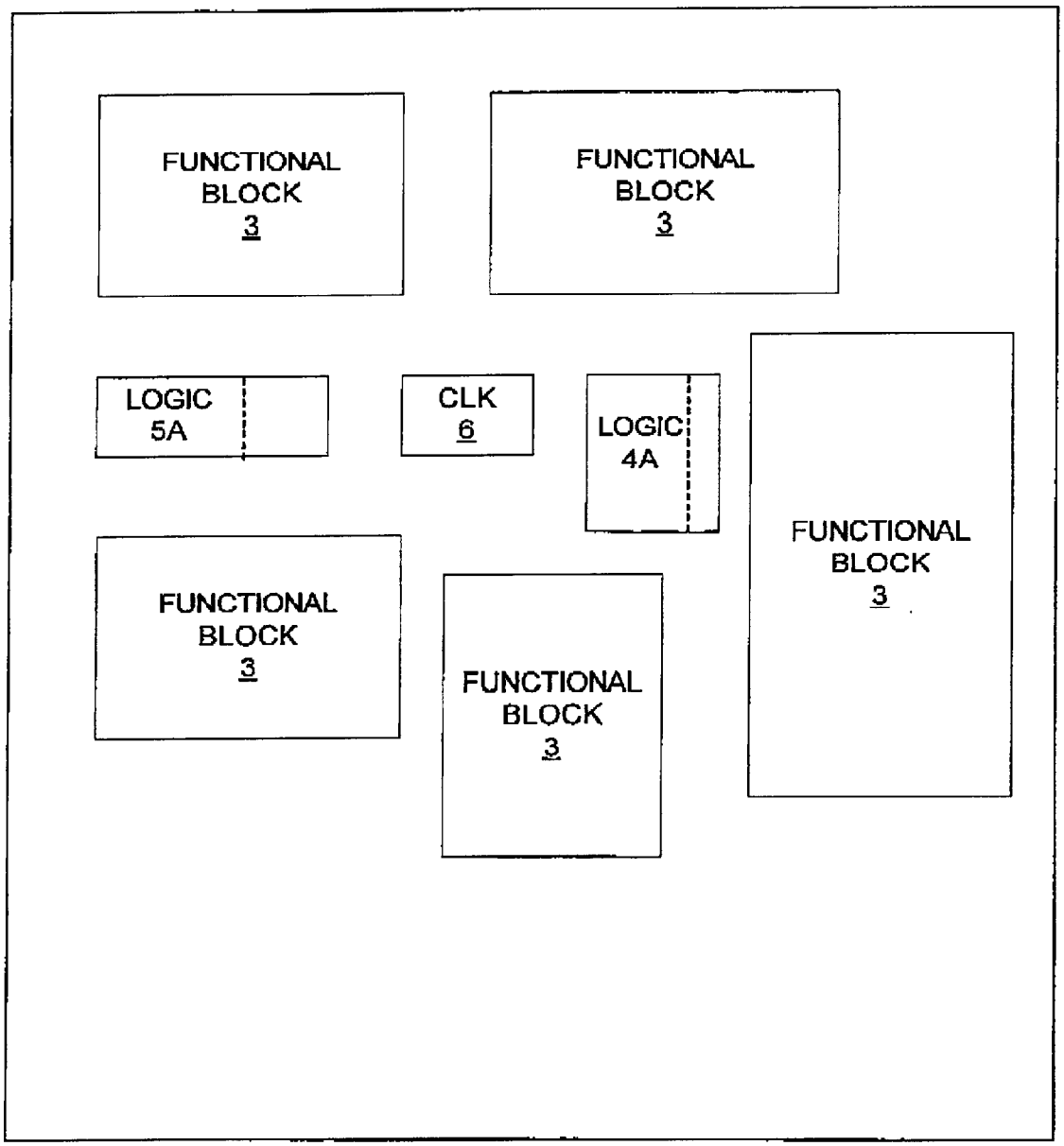
FIG. 3 is another block diagram showing the under-utilization of one of the macros of the integrated circuit.

Referring to FIG. 3, integrated circuit 2 is shown with logic macros 4 and 5 expanded from their originally calculated sizes (as shown in FIG. 2) to an intentionally expanded size as shown by reference numerals 4a and 5a. When used in their intended manner, place and route tools will seek to minimize the area that logic macros 4 and 5 will use (FIG. 2), but when used in accordance with the present invention these tools will intentionally create macros which use a greater than necessary area (FIG. 3).

Figure 4:
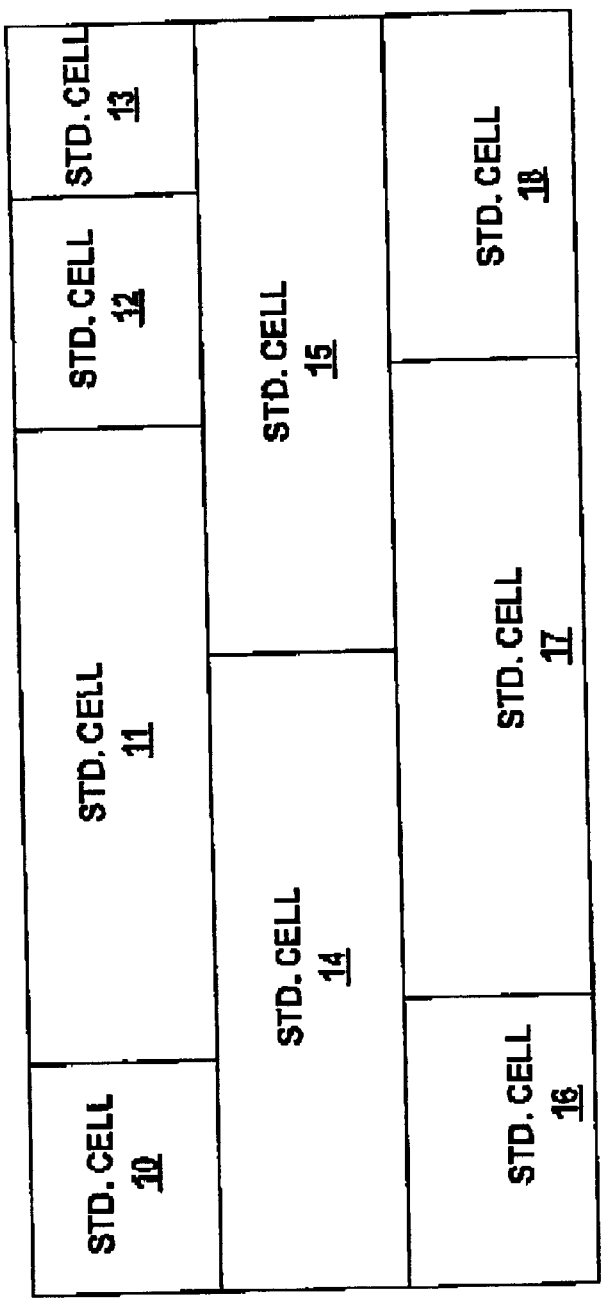
FIG. 4 is a diagram showing the standard cells that make up the macros of FIG. 3.

FIG. 4 is a simplified block diagram showing the standard cells 10, 11, 12, 13, 14, 15, 16, 17 and 18. These standard cells are basically a library of cells that include logical gates, such as AND, OR, NAND, NOR and the like. It should be noted that all of these gates are contained in a library such that all of the gates in a particular library are compatible with one another, i.e. they use the same voltage levels, have the same geometries, and the like. Each of the standard cells as shown in Figure will have the same height, i.e. all of the cells in a given library will have the same height dimension. However, the length of the standard cells will vary depending on the type and complexity of the gate. For example, a NAND or NOR gate will be of a greater length than an AND, OR or an inverter.

Figure 10:
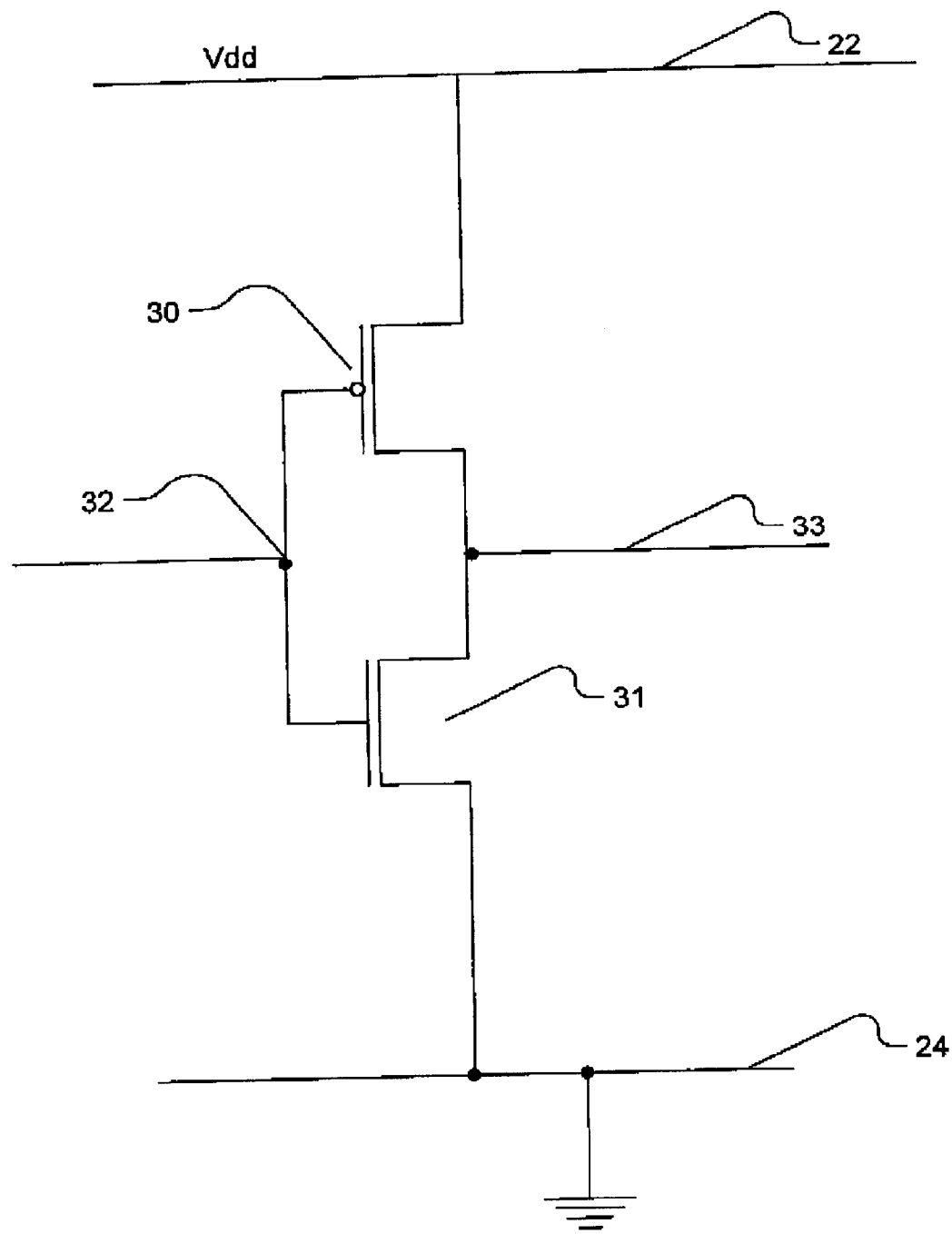
FIG. 10 is a schematic diagram showing an inverter circuit connected between the power and ground rails of a standard cell.

Further, each of the standard cells 10–18 shown in FIG. 4 will have a power and a ground rail that supplies electrical power to the gate. As an example, FIG. 10 shows an inverter circuit having a PMOS transistor 30 and NMOS transistor connected between power rail 22 and ground rail 24. When a logical 1 is present on node 31, then NMOS transistor 31 is turned on pulling the output node 33 to ground potential (logical zero). Conversely, when a logical 0 is present on node 31, PMOS transistor 30 is turned on pulling output node 33 up to the supply voltage Vdd, e.g. 3.3 volts, (logical 1).

Typically, the designer provides macros using the minimum amount of IC area. However, in accordance with the present invention, the place and route tools are used to expand the area for the macro. This expanded area will not affect the overall size of the IC. For example, as shown in FIG. 2, logic macro 4 can be expanded without affecting the real estate utilized by IC 2. That is, macro 4 and be expanded as shown in FIG. 3 to include the are encompassed by macro 4a.

In one embodiment of the present invention a designer is allowed to input certain criteria to the place and route tool calling for specific macros to be expanded by a particular percentage. For example, the designer may call for the tool to expand a macro by 50%, thereby decreasing the utilization.

Figure 5:
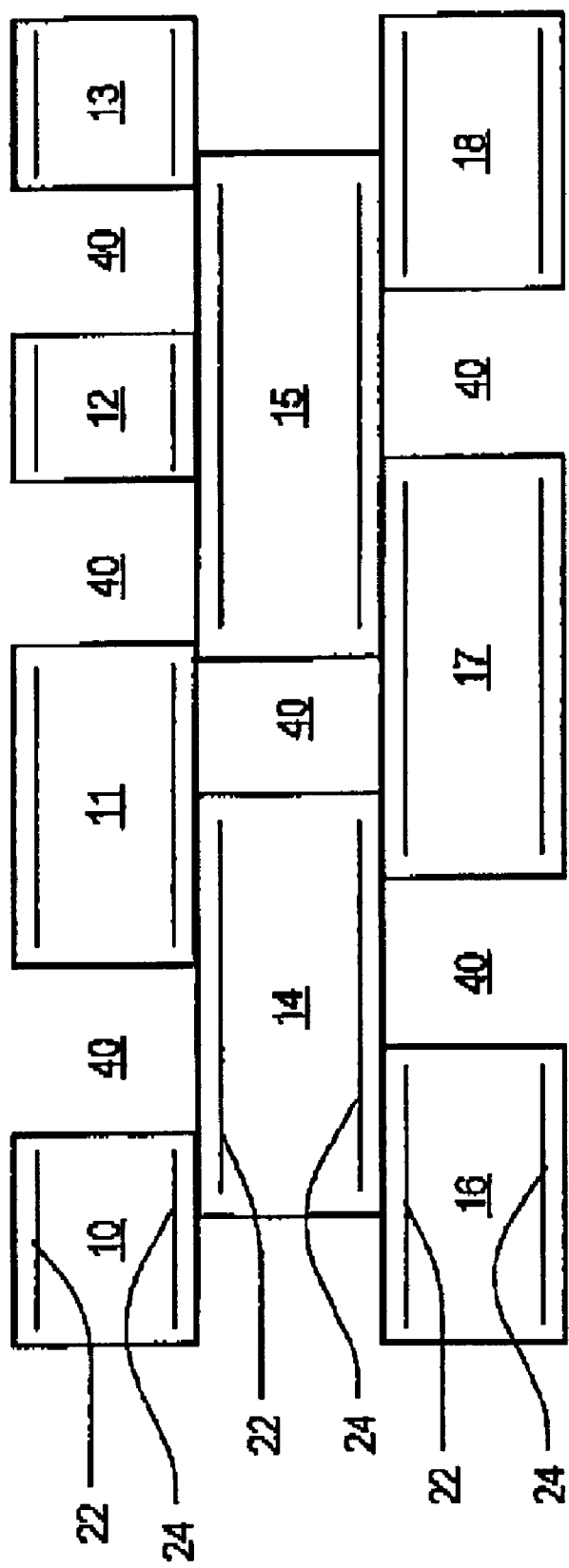
FIG. 5 illustrates the under-utilization of the standard cell of FIG. 4 and shows the power and ground rails within each cell.

FIG. 5 shows logic macro 4a after it has been expanded by the present invention. It can be seen that standard cells 10–18 are present, but have been placed to provide for spaces 40 therebetween. It can also be seen from FIG. 5 this power rails 22 and ground rails 24 are present in each of standard cells 10–18.

Figure 6:
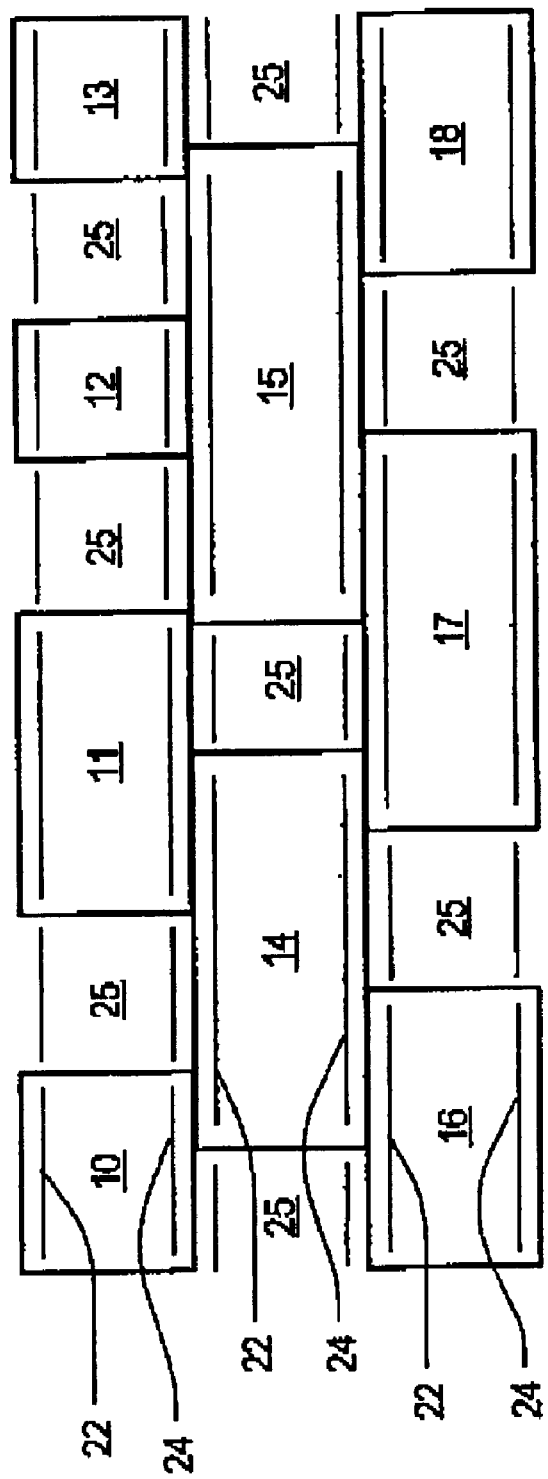
FIG. 6 illustrates the extension of the power and ground rails through the underutilized portions of the standard cell.

Referring to FIG. 6, it is also shown how the present invention provides for "filler cells" 25 to be created in spaces 40. Each of the filler cells 25 includes power and ground rails 22, 24. By creating cells 25, the present invention basically extends the power and ground rails from adjacent standard cells 10–18 through filler cells 25. In this manner the filler cells are used to continue power busses throughout the IC.

Figure 7:
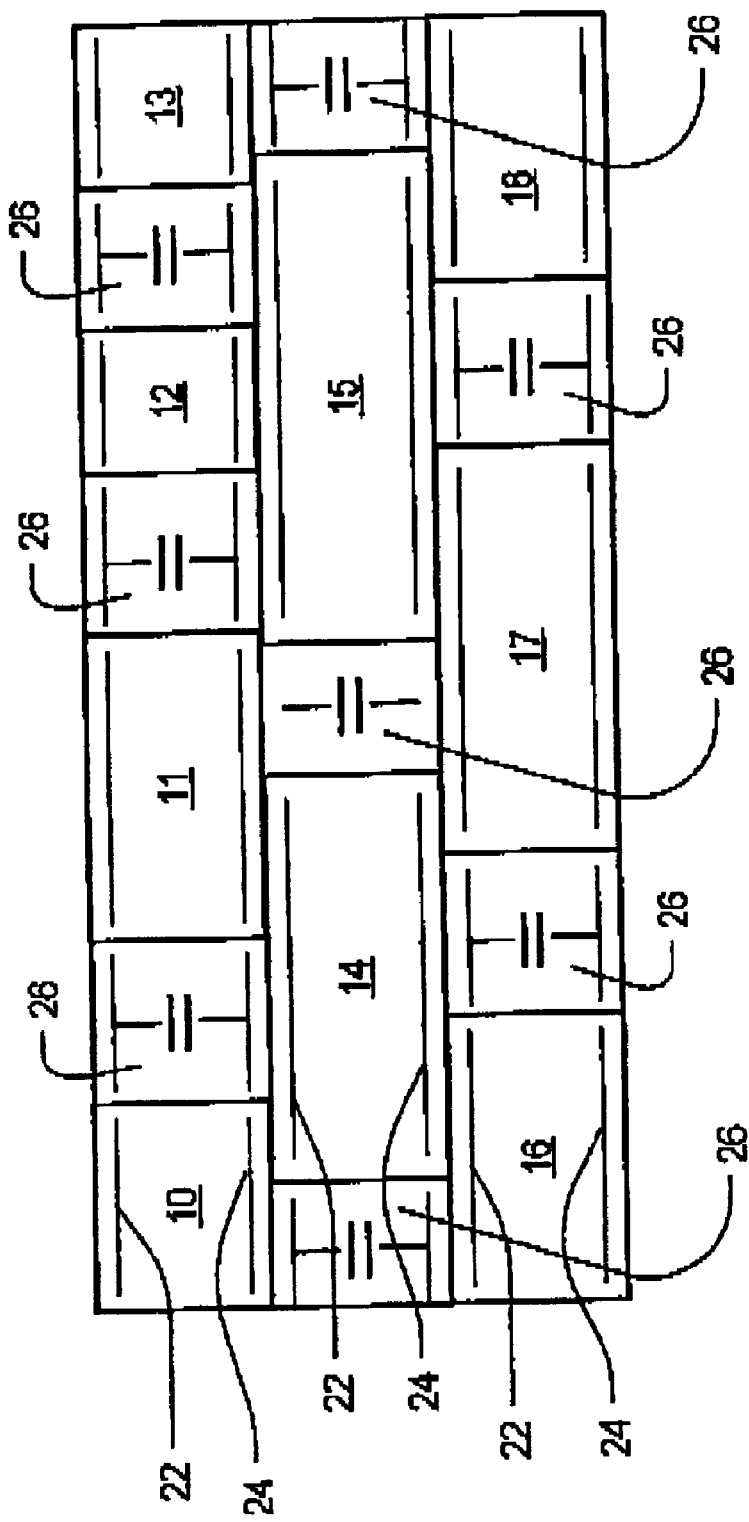
FIG. 7 is a diagram showing the coupling capacitors of the present invention as placed in the underutilized portions of the standard cells.

Next, the present invention places capacitors in the filler cells 25 thereby creating gate capacitors in the spaces 40 of FIG. 5. These capacitor cells 26 are shown in FIG. 7. Therefore, it can be seen how the present invention operates to increase capacitance on an IC at the location where it is needed the most, without increasing the overall size of the chip. This placement is done automatically by using existing tools in a non-conventional manner.

Figure 8:
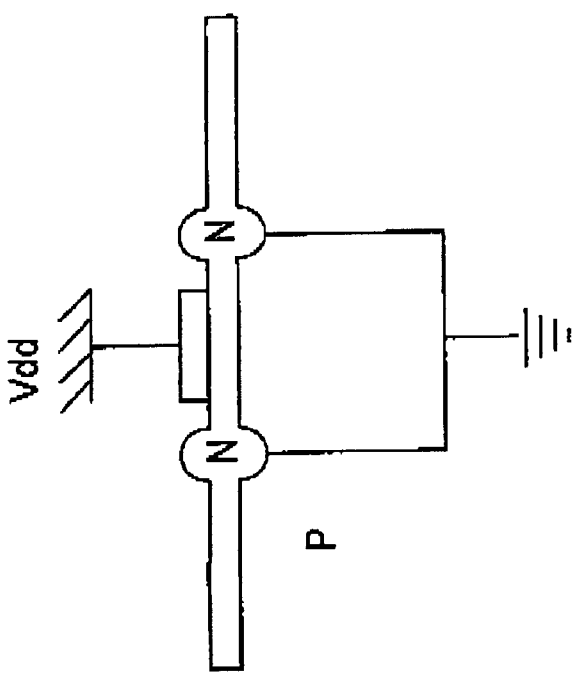
FIG. 8 is a schematic diagram of the circuit and structure of an N channel coupling capacitor of the present invention.
Figure 8:
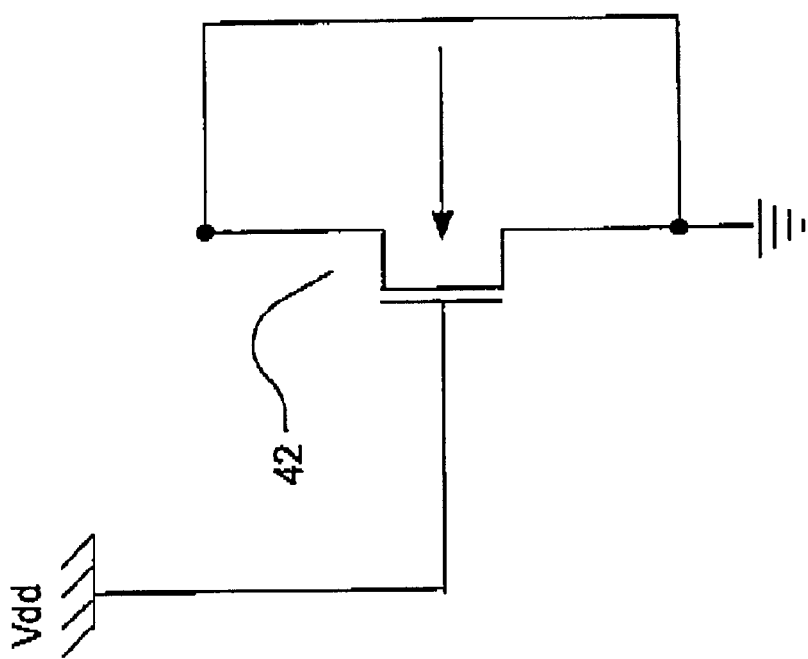
Figure 9:
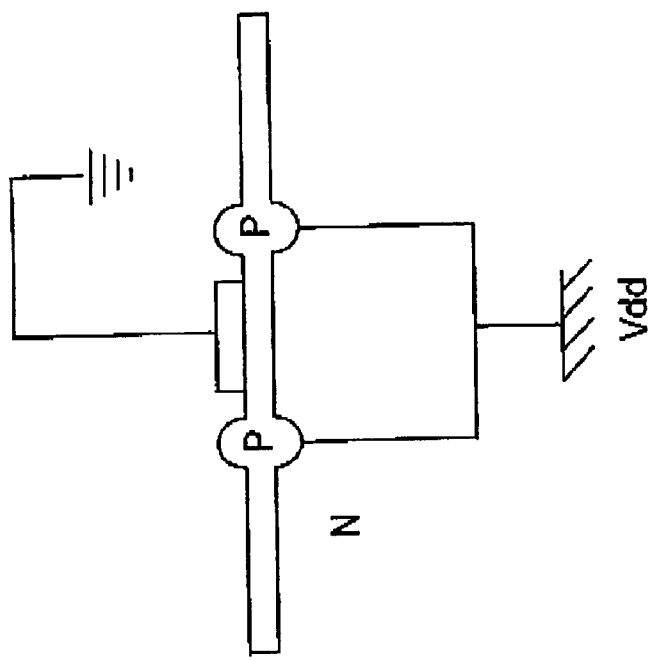
FIG. 9 is a schematic diagram of the circuit and structure of a P channel coupling capacitor of the present invention.
Figure 9:
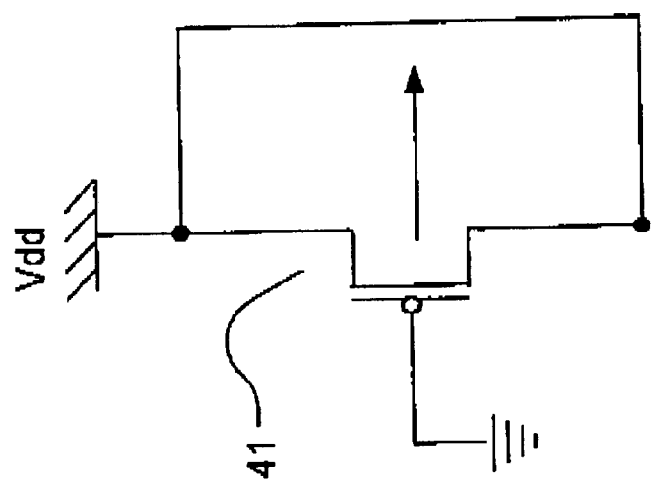

FIG. 8 shows an NMOS type gate capacitor where N transistor 42 is designed with its gate connected to Vdd and the source and drain connected to ground. In FIG. 9, PMOS transistor 41 is used to form a gate capacitor by connecting its gate to ground and the source and drain to Vdd. These types of circuits are common in the libraries of most design languages and will allow the present invention to easily create the capacitor cells described above with reference to FIG. 7.

Further, it is possible during the physical layout of integrated circuits that filler cells may be included, even when the macros are not intentionally underutilized, as described above. In these cases the present invention can also be used to increases the performance of the integrated circuit by causing such filler cells to be converted to capacitor cells. This will improve the quality of electrical power provided to any circuits having large power requirements by reducing the electrical noise.

Those skilled in the art will understand how the capacitor cells generated by the present invention will be realized as actual physical capacitors on the IC. The layout tools will physically place the capacitor cells, along with all of the other electrical components (e.g. transistors) on the substrate (wafer 1). Other tools will route wiring, based on a generated netlist, to each of the components and ensure that any timing constraints are met. Once all of the components are physically placed, then a tape is generated and masks are produced from the tape which will cause the various semiconductor materials to be doped with N and/or P material as appropriate. Metal layers, wiring layers, vias, connection pads, and the like are also formed, based on the information on the tape. The integrated circuits 2 of wafer 1 will then be populated with gate capacitors in accordance with the present invention. In this manner, the present invention causes the electrical stability in the power supplied to IC 2 (and various macros thereon) to be greatly enhanced.

Figure 11A:
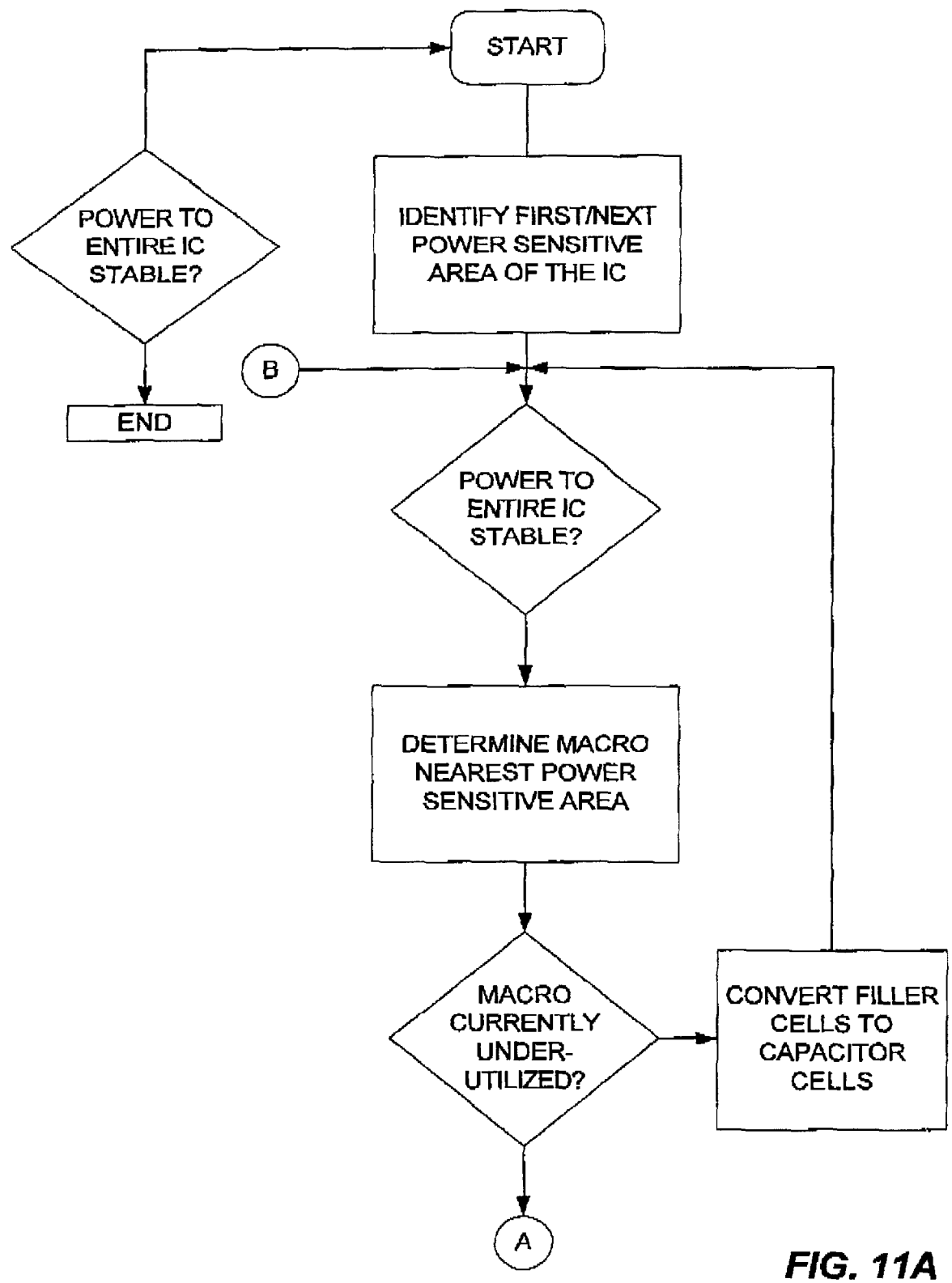
FIGS. 11a and 11b are flowcharts showing the process implemented by the design tool of the present invention.
Figure 11B:
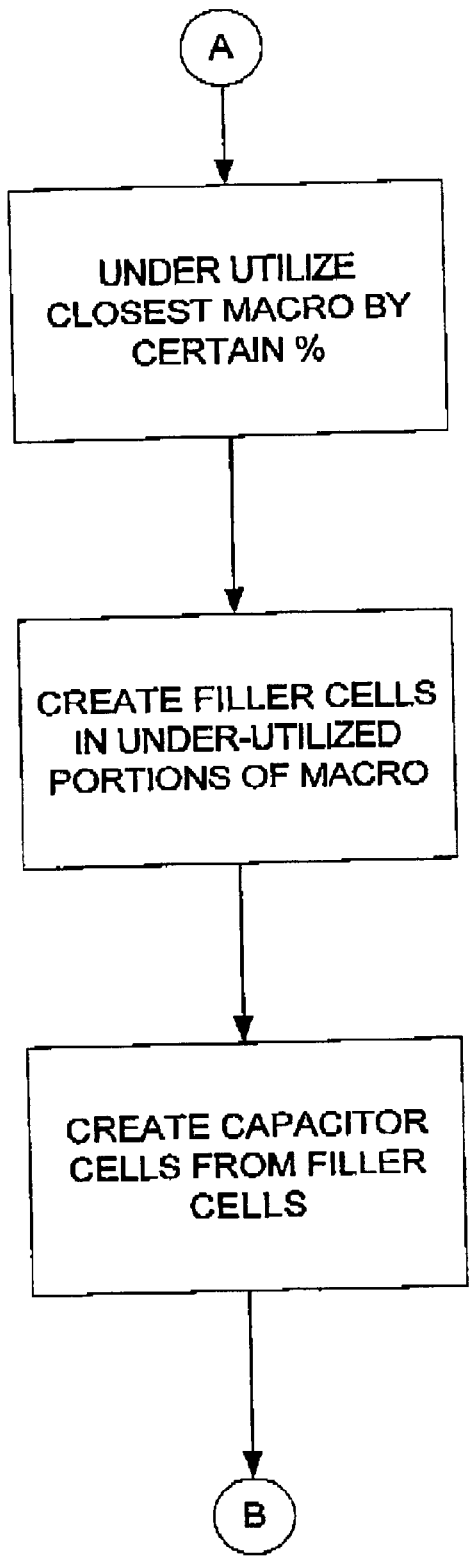

FIGS. 11a and 11b are flowcharts of the process implemented by the present invention. At step 1 the process is started and step 2 then identifies the first power sensitive area of the IC being designed. It should be noted that step 2 will identify the first power sensitive area of the chip during the first iteration through the process. However, for subsequent iterations step 2 will then determine the next power sensitive area(s) of the chip and continue to do so for as many iterations as it takes to stabilize the power to the entire IC.

Those skilled in the art will understand that power sensitive areas of the chip may be identified by simulating the functions of the chip using a simulation tool such as NC Verilog or Spectre commercially available from Cadence Design Systems, Inc. Additionally, the IC design process also utilizes various verification tools to ensure the IC operates in accordance with the design points. Simulation and verification tools allow the IC design to be run and tested before it is committed to silicon. Typical verification tools include VeriSure and VHDL/Cover also commercially available from Cadence Design Systems, Inc.

Returning to the flowchart of FIG. 11a, the present invention then determines at step 3 whether the power supply is stable at the identified sensitive areas of the IC. If so, then the process continues to step 10 where it is determined if the power supply is stable for the entire IC. When the power to the IC is stable, then no further action is required and the process ends at step 11. But, if at step 10, the power supply to the chip as a whole is still unstable, then the process of the present invention returns to step 2 where the next power sensitive area of the chip is identified.

If at step 3 it is determined that the power supply to the power sensitive area is not stable, then the method of the present invention determines the macro nearest to the location of the power sensitive area (step 4).

At step 5 it is determined whether the macro nearest the power sensitive macro is underutilized. If so, at step 6 the filler cells in the underutilized macro are converted to capacitor cells. Subsequent to step 6, the process of the present invention returns to step 3 where it is again determined if the power supply is stable at the identified power sensitive area. If so, then the process continues to step 10 as previously described. If, the power supply is still not stable, then the present invention repeats step 4 and determines the macro nearest the power sensitive area. Again, at step 5 it is determined if the nearest macro is underutilized. It should be noted that if the same macro that was previously located is again used, then it will not be considered sufficiently underutilized. When the nearest macro is not underutilized a sufficient amount, then the present invention intentionally decreases the utilization of the macro by causing it to be expanded in size by a specific percentage (step 7). Filler cells are created in the intentionally underutilized areas of the nearest macro at step 8 and capacitor cells are created from these filler cells at step 9.

Subsequent to step 9, the process of the present invention returns to step 3 where it is determined if the power supply to the previously identified power sensitive area of the IC is stable. If so, then the process continues to step 10, as previously described, or proceeds to step 4 where the location of another macro near the identified power sensitive macro is determined.

Although certain preferred embodiments have been shown and described, it should be understood that many changes and modifications may be made therein without departing from the scope of the appended claims.

What is claimed is:

1. A method of altering the electrical power supplied to at least one of a plurality of macros in an integrated circuit, comprising the steps of:

identifying any of said macros which are sensitive to noise in said electrical power;

determining if a first one of said of plurality of macros, near said sensitive macro, includes underutilized areas; and placing electrical components in said underutilized areas which reduce the noise in said electrical power provided to said sensitive macro.

2. A method according to claim 1 wherein said step of placing comprises the step of, upon determining that said first macro is not underutilized, causing said first macro to be underutilized.

3. A method altering the electrical power supplied to at least one of a plurality of macros in an integrated circuit, comprising the steps of:

identifying any of said macros which are sensitive to more noise in said electrical power;

determining if a first one of said plurality of macros, near said sensitive macro, includes underutilized areas;

upon determining that said first macro is not underutilized, under-utilizing said first macro by a pre-determined percentage; and placing electrical components in said underutilized area which reduce the noise in said electrical power provided to said sensitive macro.

4. A method according to claim 3 wherein said step of causing comprises the step of creating filler cells in said underutilized portions of said first macro.

5. A method according to claim 4 wherein said step of causing further comprises the step of converting said filler cells into capacitor cells.

6. A method according to claim 5 further comprising the step of fabricating said integrated circuit having capacitor cells included in said underutilized areas of said first macro.

7. A system for generating the physical layout of an integrated circuit and for controlling the characteristics of the electrical power supplied to at least one of a plurality of macros in said integrated circuit, comprising:

means for identifying any of said macros which are sensitive to noise in said electrical power;

means for determining if a first one of said of plurality of macros, near said sensitive macro, includes underutilized areas; and means for placing electrical components in said underutilized areas which reduce the noise in said electrical power provided to said sensitive macro.

8. A system according to claim 7 wherein said means for placing comprises means for causing said first macro to be underutilized when it is determined that said first macro is not underutilized.

9. A system for generating the physical layout of an integrated circuit and for controlling the characteristics of the electrical power supplied to at least one of a plurality of macros in said integrated circuit, comprising:

means for identifying any of said macros which are sensitive to more noise in said electrical power;

means for determining if a first one of said plurality of macros, near said sensitive macro, includes underutilized areas means for underutilizing said first macro by a predetermined percentage; and means for placing electrical components in said underutilized area which reduce the noise in said electrical power provided to said sensitive macro.

10. A system according to claim 9 wherein said means for causing comprises means for creating filler cells in said underutilized portion of said first macro.

11. A system according to claim 10 wherein said means for causing further comprises means for converting said filler cells into capacitor cells.

12. A system according to claim 11 further comprising means for fabricating said integrated circuit having capacitor cells included in said underutilized areas of said first macro.

13. A system according to claim 9 wherein said means for causing comprises means for creating capacitor cells in said underutilized portion of said first macro.

14. A system for generating the physical layout of an integrated circuit and for controlling the characteristics of the electrical power supplied to at least one of a plurality of macros in said integrated circuit, comprising:

means for identifying any of said macros which are sensitive to noise in said electrical power;

means for determining if a first one of said of plurality of macros, near said sensitive macro, includes underutilized areas; and means for placing electrical components in said underutilized areas which reduce the noise in said electrical power provided to said sensitive macro;

means for causing said first macro to be underutilized by a predetermined percentage when it is determined that said first macro is not underutilized;

means for creating filler cells in said underutilized portions of said first macro;

means for converting said filler cells into capacitor cells; and means for fabricating said integrated circuit having said capacitor cells included in said underutilized portions of said first macro.

15. A method for manufacturing an integrated circuit comprising the acts of:

forming a plurality of functional blocks comprising electronic devices that implement desired functions, wherein at least one functional block is identified as a noise-sensitive functional block;

forming an underutilized area near the at least one noise sensitive functional block; and placing electrical components in said underutilized areas which reduce noise in electrical power provided to said noise in electrical power provided to said noise-sensitive functional block.

16. The method of claim 15 wherein the act of forming an underutilized area comprises causing the chip area used by said noise-sensitive functional block to be greater than necessary for the electronic devices within the noise-sensitive functional block.

17. The method of claim 15 wherein the act of placing electrical components comprises fabricating capacitance devices in said underutilized area and coupling said capacitance devices to power and ground rails of said noise-sensitive functional block.

18. The method of claim 15 wherein the act of placing electrical components comprises:

forming power and ground rails in the underutilized area wherein the power and ground rails extend from the noise sensitive functional block; and forming capacitors in the underutilized area coupled to the power and ground rails.

19. An integrated circuit manufactured by a process comprising the steps of:

identifying any of said macros which are sensitive to more noise in said electrical power;

determining if a first one of said plurality of macros, near said sensitive macro, includes underutilized areas;

upon determining that said first macro is not underutilized, under-utilizing said first macro by a pre-determined percentage; and placing electrical components in said underutilized area which reduce the noise in said electrical power provided to said sensitive macro.

20. An integrated circuit comprising:

a plurality of functional blocks comprising electronic devices that implement desired functions, wherein at least one functional block is identified as a noise-sensitive functional block;

a region allocated to the noise-sensitive functional block which has low utilization; and electrical components in said underutilized areas which reduce noise in electrical power provided to said noise-sensitive functional block.

* * * * *